(12) United States Patent
Cirio et al.

(10) Patent No.: US 11,328,105 B2
(45) Date of Patent: *May 10, 2022

(54) COMPUTER IMPLEMENTED METHOD, SYSTEM AND COMPUTER PROGRAM PRODUCT FOR SIMULATING THE BEHAVIOR OF A KNITTED FABRIC AT YARN LEVEL

(71) Applicant: SEDDI, INC., New York, NY (US)

(72) Inventors: Gabriel Cirio, New York, NY (US); Miguel Angel Otaduy Tristan, Madrid (ES); Jorge Lopez Moreno, Madrid (ES)

(73) Assignee: SEDDI, INC., New York, NY (US)

( * ) Notice: Subject to any disclaimer, the term of this patent is extended or adjusted under 35 U.S.C. 154(b) by 137 days.

This patent is subject to a terminal disclaimer.

(21) Appl. No.: 17/021,988

(22) Filed: Sep. 15, 2020

(65) Prior Publication Data

US 2020/0410146 A1 Dec. 31, 2020

Related U.S. Application Data

(63) Continuation of application No. 15/744,643, filed as application No. PCT/ES2016/070535 on Jul. 15, 2016, now Pat. No. 10,810,333.

(30) Foreign Application Priority Data

Jul. 15, 2015 (ES) .................................. 201531038

(51) Int. Cl.
G06F 17/11 (2006.01)
G06F 30/20 (2020.01)
(Continued)

(52) U.S. Cl.
CPC ............. *G06F 30/20* (2020.01); *D04B 1/102* (2013.01); *D04B 37/02* (2013.01); *D04B 39/00* (2013.01); *G06F 17/11* (2013.01); *G06F 17/13* (2013.01)

(58) Field of Classification Search
CPC .......... G06F 30/20; G06F 17/11; G06F 17/13; D04B 1/102; D04B 37/02; D04B 39/00
(Continued)

(56) References Cited

U.S. PATENT DOCUMENTS

| 8,772,187 B2 * | 7/2014 | Ugbolue ................ D04B 21/12 |
| | | 602/44 |
| 2003/0055494 A1 * | 3/2003 | Bezuidenhout ........... A61F 2/07 |
| | | 623/1.53 |

(Continued)

FOREIGN PATENT DOCUMENTS

| CN | 102750405 B | 11/2014 |
| EP | 1439476 A2 | 7/2004 |
| JP | 2013002013 A | 1/2013 |

OTHER PUBLICATIONS

Jonathan Kaldor "Simulating Yarn-Based Cloth", May 2011, Cornell University (Year:2011), pp. 159.

(Continued)

*Primary Examiner* — Andre Pierre Louis
(74) *Attorney, Agent, or Firm* — Marton Ribera Schumann & Chang LLP; Chien-Ju Alice Chuang; Hector J. Ribera

(57) ABSTRACT

Computer implemented method, system and computer program product for simulating the behavior of a knitted fabric at yarn level. The method comprises:
retrieving structural information of a knitted fabric;
representing each stitch with four contact nodes (4) at the end of the two stitch contacts (5) between pair of loops (2), each contact node (4) being described by a 3D (Continued)

position coordinate (x) and two sliding coordinates (u, v) representing the arc lengths of the two yarns in contact;

measuring forces on each contact node (4) based on a force model including wrapping forces to capture the interaction of yarns at stitches;

calculating the movement of each contact node (4) at a plurality of time steps using equations of motion derived using the Lagrange-Euler equations, and numerically integrated over time, wherein the equations of motion account for the mass density distributed uniformly along yarns, as well as the measured forces and boundary conditions.

9 Claims, 7 Drawing Sheets

(51) Int. Cl.
*G06F 17/13* (2006.01)
*D04B 37/02* (2006.01)
*D04B 1/10* (2006.01)
*D04B 39/00* (2006.01)

(58) Field of Classification Search
USPC .............................................................. 703/6
See application file for complete search history.

(56) References Cited

U.S. PATENT DOCUMENTS

2007/0088453 A1    4/2007   Noriyuki
2010/0306082 A1   12/2010   Wolper et al.
2016/0370971 A1*  12/2016   Hackett ............... G06F 3/03543

OTHER PUBLICATIONS

Sueda et al, "Large-Scale Dynamic Simulation of Highly Constrained Strands", Jul. 2011, ACM Transactions on Graphics, vol. 30 No. 4, Article 39, University of British Columbia (Year: 2011),pp. 10.

Min et al., "Physically-based Method of Cloth Deformation," 2011, IEEE, Workshop of digital media and digital content management (Year: 2011), pp. 5.

Yuksel et al., "Snitch Meshes for Modeling Knitted Clothing with Yarn-Level Detail", 2012, ACM Transactions on Graphics, vol. 31 No. 4, Article 37 (Year: 2012), pp. 12.

* cited by examiner

| Example | Loop width (mm) | Yarn radius R (mm) | Elastic mod. Y (Pa) | Bend. mod. B (Pa) | Wrap mod. kω (Pa) | Sliding Fric. Coef. M | Rayleigh damping (α,β) |
|---|---|---|---|---|---|---|---|
| Sweater | 3 | 0.75 | 1e7 | 1e-3 | 1e-2 | 0.3 | 10, 0.01 |
| Sleeveless Shirt | 1 | 0.25 | 1e7 | 3e-4 | 1e-2 | 0.3 | 2, 0.1 |
| Sleeveless Pullover | 6 | 1.5 | 1e7 | 3e-4 | 1e-2 | 0.3 | 5, 0.01 |

Fig. 7

COMPUTER IMPLEMENTED METHOD, SYSTEM AND COMPUTER PROGRAM PRODUCT FOR SIMULATING THE BEHAVIOR OF A KNITTED FABRIC AT YARN LEVEL

CROSS-REFERENCE TO RELATED APPLICATIONS

The present application is a continuation of U.S. patent application Ser. No. 15/744,643 titled Computer Implemented Method, System and Computer Program Product for Simulating the Behavior of a Knitted Fabric at Yarn Level," filed Jan. 12, 2018, which is a national phase entry under 35 U.S.C. § 371 of International Patent Application No. PCT/ES2016/070535 titled "Computer Implemented Method, System and Computer Program Product for Simulating the Behavior of a Knitted Fabric at Yarn Level," filed on Jul. 15, 2016, which claims priority to Spanish Patent Application No. P201531038 titled "Método implementado por ordenador, sistema y producto de programa para ordenador para simular el comportamiento de textil tejido a nivel de hilo," filed on Jul. 15, 2015, and issued as Spanish Patent No. ES2597173B2, all of which are incorporated herein by reference in their entirety.

FIELD OF THE INVENTION

The present invention is comprised within the field of simulations of the behavior of knitted cloth at yarn-level.

BACKGROUND OF THE INVENTION

Knitted cloth is made of yarns that are stitched in regular patterns, and its macroscopic behavior is dictated by the contact interactions between such yarns. The knitted fabrics are held together by stitching yarns, in contrast to woven fabrics, which are held together by interlacing yarns (two sets of orthogonal yarns called warp and weft).

The vast majority of garments are made of a yarn structure, either knitted or woven, and the macroscopic behavior of cloth is dictated by the mechanical interactions taking place at the yarn level. However, most cloth simulation models in computer graphics ignore the relevance of such yarn structure, represent the cloth surface as an arbitrary mesh, and compute internal elastic forces either by discretizing continuum elasticity models [Etzmuss et al. 2003] or using discrete elastic elements [Breen et al. 1994; Provot 1995].

Yarn-level models of knitted and woven fabrics have a long history. In 1937 Peirce [Peirce 1937] proposed a geometric model to represent the crossing of yarns in woven fabric. Yarn-level models have been thoroughly studied in the field of textile research, initially using analytical yarn models [Hearle et al. 1969] to predict the mechanical behavior of fabric under specific modes of deformation [Peirce 1937; Kawabata et al. 1973]. Later, textile research relied on continuum models to simulate most yarn deformation modes and complex yarn-yarn contact interactions [Ng et al. 1998; Page and Wang 2000; Duan et al. 2006]. A number of techniques have been developed to alleviate the large computational burden of yarn-level continuum models, such as using multiscale models that resort to costly yarn-level mechanics only when needed [Nadler et al. 2006], or replacing the complex volumetric yarns by simpler elements such as beams, trusses and membranes [Reese 2003; McGlockton et al. 2003].

Knitted fabric has received less attention compared to woven, due to the higher geometric complexity, which leads to more involved yarn contact interactions. Splines are often used to efficiently represent knit yarns, as introduced by [Remion et al. 1999]. Splines have also been used to approximate woven fabric in a purely geometric way (see e.g., [Renkens and Kyosev 2011; Jiang and Chen 2005]), sometimes combined with thin sheet models in a multiscale fashion [Nocent et al. 2001].

Often, yarn-level models capture the most relevant deformations and yarn interactions using specialized force models, such as bending and crossover springs to capture cross-sectional deformation and shear at crossover points [King et al. 2005; Xia and Nadler 2011], truss elements acting as contact forces between yarns to capture shear jamming [King et al. 2005], or a slip velocity to capture yarn sliding [Parsons et al. 2013]. As a consequence, these models enable the simulation of realistic macroscopic behaviors of fabric. However, yarn-level models in textile research focus on small portions of fabric, often in controlled experiments, and cannot simulate entire garments under free motions, nor single yarn plastic effects such as snags, pulls and pullouts.

Recently, yarn-level models that address these shortcomings have emerged in the field of computer graphics. The seminal work of [Kaldor et al. 2008] was the first approach capable of simulating entire garments at the yarn level in tractable time, from loose scarves and leg warmers to large sweaters. Focusing on knits, they modeled the mechanics of individual yarns using inextensible rods, and computed yarn-yarn contact through stiff penalty forces and velocity-filter friction, allowing them to predict the large-scale behavior of full garments from fundamental yarn mechanics. The performance of this approach was later improved in [Kaldor et al. 2010] by reusing linearized contact information whenever possible, using local rotated linearizations of penalty forces to accelerate yarn-yarn contact handling. On the other hand, geometric methods to create simulation-ready yarn-level models of many knit patterns are disclosed in [Yuksel et al. 2012].

More recently, [Cirio et al. 2014] focused on woven cloth by taking a different approach, assuming that yarn-yarn contacts are persistent in time, even under moderately large plastic deformations. This assumption avoids the need of expensive yarn-yarn collision detection and contact handling, thus greatly reducing simulation costs. In this document every yarn in the fabric is simulated as a rod, introducing additional sliding degrees of freedom at yarn crossings to allow yarns to slide along each other and thus generate complex plastic effects such as snags, pulls, fracture and frayed edges. Other yarn-level models (mainly geometric and analytical ones) also assumed persistent contact, but they did not incorporate sliding coordinates.

In [Sueda et al. 2011] a general formulation of Lagrangian mechanics is introduced to simulate efficiently the dynamics of highly constrained rods, through an optimal set of generalized coordinates that combine absolute motion with sliding on constraint manifolds. The model of persistent contacts designed by [Cirio et al. 2014] constitutes an application of Sueda's framework to the case of two rods in sliding contact.

Focusing on simulations for knitted cloth, the already-commented document [Kaldor et al. 2008] proposes an alternative approach describing individual yarns using a rod model, and resolving contact interactions between yarns. A yarn-based model enables the simulation of complex small-scale effects, such as yarn-yarn friction and sliding, snags, pulls, frayed edges, or detailed fracture. [Kaldor et al. 2008]

also shows that, with a yarn-based model, the macroscopic nonlinear mechanics of garments arise naturally through aggregation of yarn-level structural effects. But this method is hindered by a major challenge: efficient and robust detection and resolution of all yarn contacts.

The present invention proposes a representation of knitted cloth using persistent contacts with yarn sliding. Discretization based on persistent contacts has been used for woven cloth before, but the application of this discretization to knitted cloth is highly non-trivial. There are fundamental structural differences in the arrangement of yarns in woven and knitted cloth, which produce different inter-yarn contact mechanics as well as different yarn-level deformation modes. For woven cloth, the placement of such persistent contacts and hence the discretization of the fabric can be naturally inferred from the woven structure. For knitted cloth, on the other hand, designing an effective discretization of knitted yarns using persistent contacts while retaining all the important degrees of freedom of the knitted structure is not straightforward. Defining yarn-level force models that capture the macroscopic behavior of knitted cloth is not trivial either.

With the special representation of knitted cloth used in the present invention, the above mentioned problems are solved, achieving robust, fast and efficient simulations, and also being able to simulate much denser fabrics.

REFERENCES

BREEN, D. E., HOUSE, D. H., AND WOZNY, M. J. 1994. Predicting the drape of woven cloth using interacting particles. In Proceedings of the 21st Annual Conference on Computer Graphics and Interactive Techniques, ACM, New York, N.Y., USA, SIGGRAPH '94, 365-372.

CIRIO, G., LOPEZ-MORENO, J., MIRAUT, D., AND OTADUY, M. A. 2014. Yarn-level simulation of woven cloth. ACM Trans. Graph. 33, 6 (November), 207:1-207:11.

DE JOYA, J., NARAIN, R., O'BRIEN, J., SAMII, A., AND ZORDAN, V. Berkeley garment library. http://graphics.berkeley.edu/resources/GarmentLibrary/.

DUAN, Y., KEEFE, M., BOGETTI, T. A., AND POWERS, B. 2006. Finite element modeling of transverse impact on a ballistic fabric. International Journal of Mechanical Sciences 48, 1, 33-43.

DUHOVIC, M., AND BHATTACHARYYA, D. 2006. Simulating the deformation mechanisms of knitted fabric composites. Composites Part A: Applied Science and Manufacturing 37, 11.

ETZMUSS, O., KECKEISEN, M., AND STRASSER, W. 2003. A fast finite element solution for cloth modelling. In Computer Graphics and Applications, 2003. Proceedings. 11th Pacific Conference on, 244-251.

HEARLE, J. W. S., GROSBERG, P., AND BACKER, S. 1969. Structural Mechanics of Fibers, Yarns, and Fabrics, vol. 1. JohnWiley & Sons Inc, New York.

JIANG, Y., AND CHEN, X. 2005. Geometric and algebraic algorithms for modelling yarn in woven fabrics. Journal of the Textile Institute 96, 4, 237-245.

KALDOR, J. M., JAMES, D. L., AND MARSCHNER, S. 2008. Simulating knitted cloth at the yarn level. ACM Trans. Graph. 27 3, 65:165:9.

KALDOR, J. M., JAMES, D. L., AND MARSCHNER, S. 2010. Efficient yarn-based cloth with adaptive contact linearization. ACM Transactions on Graphics 29, 4 (July), 105:1-105:10.

KAWABATA, S., NIWA, M., AND KAWAI, H. 1973. The finite-deformation theory of plain-weave fabrics part i: The biaxial-deformation theory. Journal of the Textile Institute 64, 1, 21-46.

KING, M. J., JEARANAISILAWONG, P., AND SOCRATE, S. 2005. A continuum constitutive model for the mechanical behavior of woven fabrics. International Journal of Solids and Structures 42, 13, 3867-3896.

MCGLOCKTON, M. A., COX, B. N., AND MCMEEKING, R. M. 2003. A binary model of textile composites: Ill high failure strain and work of fracture in 3D weaves. Journal of the Mechanics and Physics of Solids 51, 8, 1573-1600.

NADLER, B., PAPADOPOULOS, P., AND STEIGMANN, D. J. 2006. Multiscale constitutive modeling and numerical simulation of fabric material. International Journal of Solids and Structures 43, 2, 206-221.

NG, S.-P., TSE, P.-C., AND LAU, K.-J. 1998. Numerical and experimental determination of in-plane elastic properties of 2/2 twill weave fabric composites. Composites Part B: Engineering 29, 6, 735-744.

NOCENT, O., NOURRIT, J.-M., AND REMION, Y. 2001. Towards mechanical level of detail for knitwear simulation. In Winter School in Computer Graphics and Visualization, 252-259.

PAGE, J., AND WANG, J. 2000. Prediction of shear force and an analysis of yarn slippage for a plain-weave carbon fabric in a bias extension state. Composites Science and Technology 60, 7, 977-986.

PAN, N., AND BROOKSTEIN, D. 2002. Physical properties of twisted structures. ii. industrial yarns, cords, and ropes. Journal of Applied Polymer Science 83, 3, 610-630.

PARSONS, E. M., KING, M. J., AND SOCRATE, S. 2013. Modeling yarn slip in woven fabric at the continuum level: Simulations of ballistic impact. Journal of the Mechanics and Physics of Solids 61, 1, 265-292.

PEIRCE, F. T. 1937. The geometry of cloth structure. Journal of the Textile Institute Transactions 28, 3, T45-T96.

PROVOT, X. 1995. Deformation constraints in a mass-spring model to describe rigid cloth behavior. In In Graphics Interface, 147-154.

REESE, S. 2003. Anisotropic elastoplastic material behavior in fabric structures. In IUTAM Symposium on Computational Mechanics of Solid Materials at Large Strains, C. Miehe, Ed., no. 108 in Solid Mechanics and Its Applications. Springer Netherlands, 201-210.

REMION, Y., NOURRIT, J.-M., AND GILLARD, D. 1999. Dynamic animation of spline like objects. In Winter School in Computer Graphics and Visualization, 426-432.

RENKENS, W., AND KYOSEV, Y. 2011. Geometry modelling of warp knitted fabrics with 3d form. Textile Research Journal 81, 4, 437-443.

SUEDA, S., JONES, G. L., LEVIN, D. I. W., AND PAI, D. K. 2011. Large-scale dynamic simulation of highly constrained strands. ACM Trans. Graph. 30, 4, 39:1-39:10.

XIA, W., AND NADLER, B. 2011. Three-scale modeling and numerical simulations of fabric materials. International Journal of Engineering Science 49, 3, 229-239.

YUKSEL, C., KALDOR, J. M., JAMES, D. L., AND MARSCHNER, S. 2012. Stitch meshes for modeling knitted clothing with yarn-level detail. ACM Trans. Graph. 31, 4, 37:1-37:12.

DESCRIPTION OF THE INVENTION

The present invention introduces a compact yarn-level representation of knitted fabrics, based on the placement of four persistent contacts with yarn sliding on each stitch, the stitch being either a knit or a purl stitch. This efficient representation of knitted cloth at the yarn level treats yarn-yarn contacts as persistent, thereby avoiding expensive contact handling altogether. A compact representation of yarn geometry and kinematics is used, capturing the essential deformation modes of yarn loops and stitches with a minimum cost. Based on this representation, force models that reproduce the characteristic macroscopic behavior of knitted fabrics are created (force models for inter-yarn friction, yarn bending, and stitch wrapping).

A first aspect of the present invention refers to a computer implemented method for simulating the behavior of a knitted fabric at yarn level. The method comprises the following steps:

Retrieving structural information of a knitted fabric made of knit and/or purl stitches, said structural information at least comprising the layout of the knitted fabric including the density of stitches (i.e. the number of stitches per length unit) in course and wale directions and the type of each stitch.

Applying boundary conditions at a plurality of time steps.

Representing each knit or purl stitch using four contact nodes, located at the end of the two stitch contacts between pair of loops, wherein each contact node is described by a 3D position coordinate representing the position of the contact node and two sliding coordinates representing the arc lengths of the two yarns in contact.

Measuring forces on each contact node based on a force model, the forces being measured on both the 3D position coordinate and the sliding coordinates of the contact node, and the force model at least including wrapping forces to capture the interaction of yarns at stitches.

Calculating the movement of each contact node at a plurality of time steps using equations of motion derived using the Lagrange-Euler equations, and numerically integrated over time, wherein the equations of motion account for the mass density distributed uniformly along yarns, as well as the measured forces and boundary conditions.

The structural information of the knitted fabric may also include any of the following, or a combination thereof:
density (i.e. mass/volume) of the yarns;
yarn radius;
mechanical parameters for the different yarn types used in the knitted fabric, said mechanical parameters including at least any of the following:
the bending modulus (B),
the elastic modulus (Y),
stitch wrapping stiffness ($k_w$),
sliding friction coefficient ($\mu$),
damping-to-mass ratio,
damping-to-stiffness ratio.

In a preferred embodiment the wrapping forces at each stitch contact includes the computation of an elastic potential V according to the following equation:

$$V = \tfrac{1}{2} k_w L (\psi - \psi_0)^2$$

wherein $\psi$ is the wrapping angle, $\psi_0$ is the rest angle and L is the rest length of the stitch contact (5).

The force model can include bending forces using the computation of an elastic potential V between two consecutive yarn segments $[q_2, q_0]$ and $[q_0, q_1]$ according to the following equation:

$$V = k_b \frac{\theta^2}{\Delta u}$$

where $k_b = B\pi R^2$, with R the yarn radius, $\Delta u$ is the summed arc length of both segments, and $\theta$ is the bending angle between the yarn segments $[q_2, q_0]$ and $[q_0, q_1]$.

The force model may include sliding friction forces by using the sliding friction coefficient ($\mu$) and the sliding coordinates. The force model may also include stretch forces using the elastic modulus (Y) of the yarns.

A second aspect of the present invention refers to a system for simulating the behavior of a knitted fabric at yarn level. The system comprises:

Data storing means for storing structural information of a knitted fabric, said structural information at least comprising the layout of the knitted fabric including the density of stitches in course and wale directions and the type of each stitch; and Data processing means configured for:
Retrieving said structural information and applying boundary conditions at a plurality of time steps.

Representing each knit or purl stitch using four contact nodes, located at the end of the two stitch contacts between pair of loops, wherein each contact node is described by a 3D position coordinate representing the position of the contact node and two sliding coordinates representing the arc lengths of the two yarns in contact.

Measuring forces on each contact node based on a force model, the forces being measured on both the 3D position coordinate and the sliding coordinates of the contact node, and the force model at least including wrapping forces to capture the interaction of yarns at stitches.

Calculating the movement of each contact node at a plurality of time steps using equations of motion derived using the Lagrange-Euler equations, and numerically integrated over time, wherein the equations of motion account for the mass density distributed uniformly along yarns, as well as the measured forces and boundary conditions.

A third aspect of the present invention refers to a computer program product for simulating the behavior of a knitted fabric at yarn level, comprising computer usable program code for performing the steps of the computer implemented method previously defined. The computer program product is preferably stored in a program support means.

Experiments that evaluate the influence of yarn-level mechanical and geometric parameters on macroscopic mechanical behavior have been carried out, observing the characteristic stretch, shear, and bending behavior of knitted fabrics, with manifest anisotropy, nonlinear stretch behavior, and plasticity. The efficiency of the method is demonstrated on simulations with millions of degrees of freedom (hundreds of thousands of yarn loops), almost one order of magnitude faster than previous techniques.

Thus, the present invention proposes a representation of knitted cloth using persistent contacts with yarn sliding. With this representation, robust and efficient simulations are achieved, since the detection and resolution of yarn-yarn contacts altogether is avoided. On garments of similar complexity to those simulated by Kaldor et al. [2010], such as a sweater with over 56K stitch loops, the present invention achieves a 7× speed-up (without accounting for hardware differences). But the method of the present invention is also able to simulate much denser fabrics, up to common real-world gauges, such as a shirt with 325K loops.

The present invention is an efficient method to simulate knitted cloth at the yarn level, using an efficient representation of knitted cloth that treats yarn-yarn contacts as persistent, thereby avoiding expensive contact handling altogether. The present method uses compact discretization of stitch contacts that allows to capture the relevant yarn-level deformation modes, achieving complex, nonlinear and plastic effects at a macroscopic scale. The present model can handle any knit pattern based on purl and knit stitches between two yarns.

The present invention achieves efficient yarn-level simulations of knitted cloth, with high resolution and short computational time, predicting the mechanical and visual behavior of any kind of knitted cloth made of knit and/or purl stitches. The present invention predicts in a robust, realistic and efficient way, the behavior of a whole cloth starting from the behavior of individual yarns.

The invention provides the following advantages in the textile sector:
Reduced costs, increased productivity and greater flexibility in the design and innovation of textile fabrics. Performance of new fabrics can be evaluated on simulated prototypes.
Performing textile analysis to evaluate wrong design of products.
Conducting high quality animations of new garments for marketing purposes.

The invention may be applied on different sectors:
Textile fabric design.
Fashion and clothing design.
Commercialization of clothing.
Automotive Sector: Textile upholstery items.
Medicine: woven fabrics for manufacturing stents, etc.

BRIEF DESCRIPTION OF THE DRAWINGS

A series of drawings which aid in better understanding the invention and which are expressly related with an embodiment of said invention, presented as a non-limiting example thereof, are very briefly described below.

FIG. 7 shows a table with parameter values used in different examples.

DESCRIPTION OF A PREFERRED
EMBODIMENT OF THE INVENTION

The present invention proposes a representation of knitted cloth using persistent contacts that is compact and aims to capture the mechanically relevant characteristics of the yarn structure.

Figure 1:
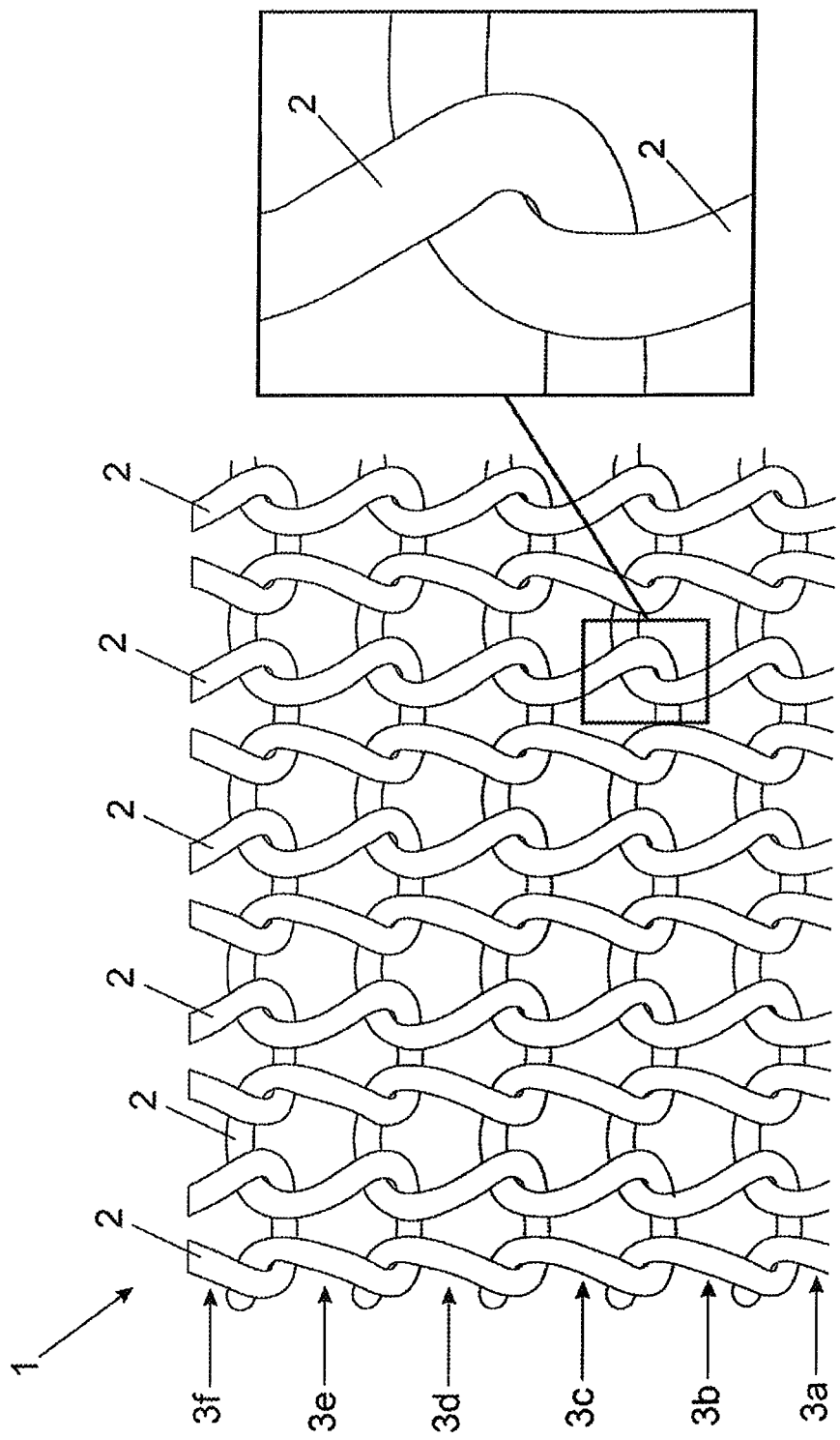
FIG. 1 depicts several loops of a fabric knitted in stockinette pattern and a zoom on a stitch in 3D.

The structure of knitted fabrics is disclosed in [Kaldor et al. 2008], which provides a description of how yarns are stitched together to produce a knitted fabric and its behavior. A single yarn is laid out in a chain of loops along a row of the so-called course direction. These loops are pulled either up or down through the loops of the previous row, in a knit or purl stitch respectively. Loops appear stacked in columns on the wale direction. When the yarn reaches the end of a row, it is typically bent back to form the next row. The first row and the last row are stitched in a different way to avoid unraveling, while the beginning and end of a yarn are simply tied to the fabric. FIG. 1 shows several loops 2 of a knitted fabric 1, knitted in stockinette pattern (which is the simplest pattern, with all knit stitches; other patterns made of knit and/or purl stitches may be considered, such as garter, which alternates rows of knit and purl stitches, and rib, which repeats two knit stitches followed by two purl stitches) and a zoom on a stitch in 3D. The loops 2 run along different rows ($3a$, $3b$, $3c$, $3d$, $3e$, $3f$).

Yarns of a knitted fabric undergo multiple different forces, both internal due to their own deformation, and external due to yarn-yarn contact. The macroscopic mechanical behavior of knitted garments is largely determined by yarn-yarn contact, with three dominating effects:
(i) Contact at stitches, with yarns wrapped around each other.
(ii) Contact between adjacent loops when a stitch tightens.
(iii) Friction under inter-yarn sliding or shear.

Macroscopic in-plane deformation (i.e., stretch and shear) of a garment is dominated first by the bending resistance of yarns as loops deform, then adjacent loops may enter into contact, and finally additional deformation requires stretching the yarns themselves. When a knitted fabric is laid flat, elastic energy is present due to yarn bending and yarn wrapping. When the fabric is allowed to relax, it will undergo some macroscopic deformation. With a garter pattern, the bending deformation produced by stitch unwrapping is compensated on alternate rows and columns of loops. On a stockinette pattern, rows and columns curl in opposite directions. On a rib pattern, each pair of stitches curls in opposite direction, leading to a significant natural compression of the fabric.

The present invention proposes the discretization of a knitted fabric using contact nodes. To discretize yarns in a knitted fabric, the minimum set of persistent contacts that allow representing all the relevant deformation modes of yarns are identified. The fabric is discretized by placing a node at each persistent contact, and referring to it as a contact node. At a contact node, the two yarns in contact are represented as a single 3D point, thereby eliminating the need to detect and resolve contact. The contact node is augmented with sliding coordinates that allow the yarns to slide tangent to the contact.

Figure 2:
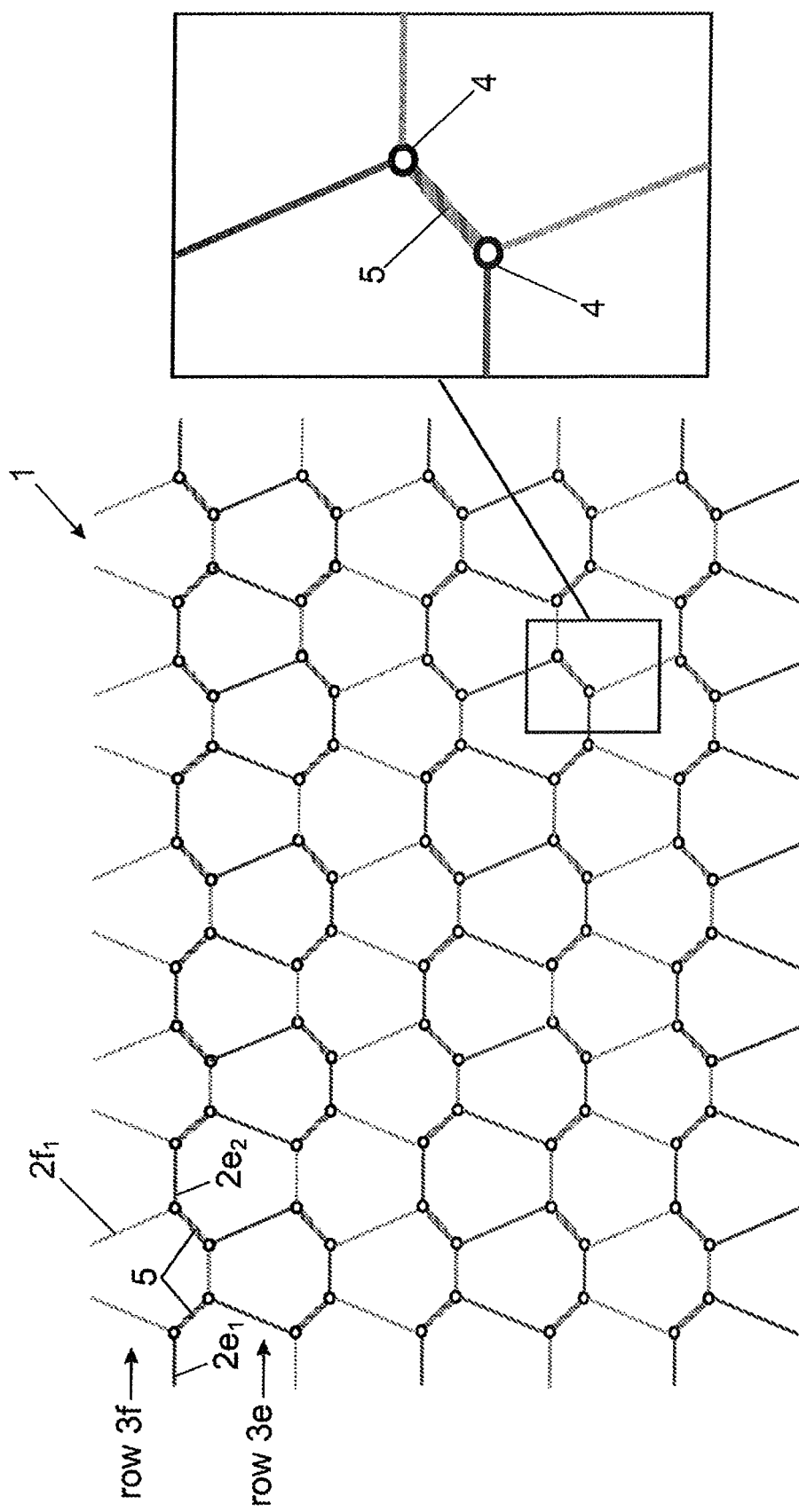
FIG. 2 shows, according to the present invention, the discretization of the knitted fabric of FIG. 1 and a zoom on a discretized stitch with two persistent contacts.

FIG. 2 depicts the discretization of the knitted fabric 1 of FIG. 1 and a zoom on a discretized stitch contact 5, the segment defined by two persistent contacts (contact nodes 4) were two yarns are wrapped around each other persistently. In a stitch, a loop from one row is passed through two loops of the previous row (for instance, loop $2f_1$ of row $3f$ is passed through loops $2e_1$ and $2e_2$ of the previous row $3e$). This arrangement produces two stitch contacts 5.

Figure 3:
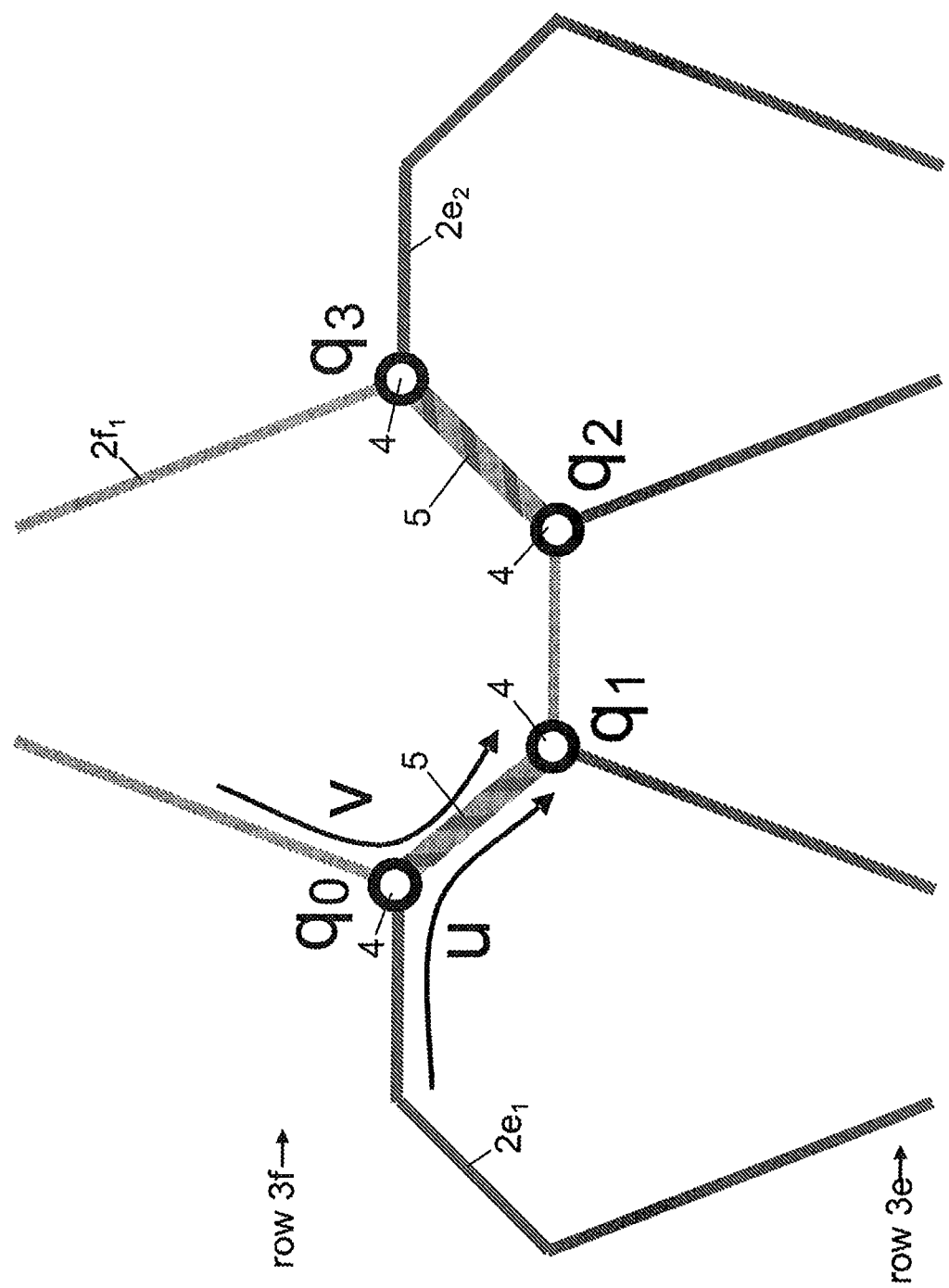
FIG. 3 depicts in detail the four contact nodes in a stitch.

FIG. 3 depicts in more detail the loop $2f_1$ of row $3f$ forming a stitch with loops $2e_1$ and $2e_2$ of the previous row $3e$. In a knit or purl stitch, a loop $2f_1$ of a new row is passed through two loops ($2e_1$, $2e_2$) of the previous row, embracing them and producing contacts between pair of loops $2f_1$-$2e_1$ and $2f_1$-$2e_2$, in particular two stitch contacts 5. In the model of the present invention, two contact nodes 4 are considered at the end of each stitch contact 5 between pair of loops, thus producing a total of four contact nodes 4 ($q_0$, $q_1$, $q_2$, $q_3$) for each knit/purl stitch. The sliding coordinates u and v of contact node $q_0$, which will be later explained, are also shown in FIG. 3.

During normal operation of the fabric, i.e., unless a stitch is pulled out, the two yarns at each stitch contact 5 are wrapped around each other persistently. Knitted fabrics are thus discretized by placing two contact nodes 4 at the two end points of each stitch contact 5. This discretization captures the most important degrees of freedom in a loop, and allows to represent any knit pattern based on purl and knit stitches between two yarns. Using a single contact node 4 per stitch contact 5 would miss important loop deformation modes, such as the stretching of fabric due to loop deformation.

For simulation purposes, the yarn is considered to be formed by straight segments between contact nodes 4. For rendering purposes, on each contact node 4 a plane is fit to the incident segments, the yarns are offset along the normal of this plane, and the resulting points are interpolated using smooth splines.

As shown in FIG. 3, yarns are allowed to slide at contact nodes 4, hence each contact node q=(x; u; v) constitutes a 5-DoF (5 degrees of freedom) node, with x the 3D position of the node, and u and v the arc lengths of the two yarns in contact, which act as sliding coordinates. The 3D position of a point inside the segment is given by:

$$x(u) = \frac{u_1 - u}{\Delta u} x_0 + \frac{u - u_0}{\Delta u} x_1, \qquad (1)$$

where $\Delta u = u_1 - u_0$ is the rest length of the segment.

Each loop 2 has typically four stitch contacts 5, hence it shares eight contact nodes 4 with other loops. As a result, a garment with N loops has approximately 4N contact nodes and 20N DoFs. The framework of [Sueda et al. 2011] is followed to derive the equations of motion, linearly interpolating kinematic magnitudes along yarn segments and applying the Lagrange-Euler equations.

Force models that capture these essential yarn contact mechanics under the compact yarn representation is now described, demonstrating how they reproduce the expected nonlinearity and anisotropy of knitted fabrics. The forces applied on the knit model include gravity, internal elastic forces of yarns, non-penetration contact forces between yarns, friction, and damping. In this design of the specific force models, key deformation modes of the yarn structure that suffer resistance have been identified. In some cases, particularly for yarn bending, the force model groups the effect of both internal and contact forces. This is a crucial aspect in the design of force models with persistent contacts, because the lack of degrees of freedom in the normal direction of contacts prevents the use of typical penalty potentials or non-penetration constraints.

For gravity, yarn stretch (governed by the elastic modulus Y), and contact between adjacent loops the same formulations for woven cloth in [Cirio et al. 2014] are used.

The present force model includes elastic potentials for two major deformation modes, yarn bending and stitch wrapping, which will be first discussed. Details of sliding friction forces will also be later explained, although similar forces are added to all deformation modes. An elastic force for the preservation of the lengths of stitch contacts will also be described. For damping, the Rayleigh model is used.

According to textile literature [Duhovic and Bhattacharyya 2006], the contribution of dynamic yarn twisting is minor, especially compared to dominant forces such as stretch and bending. Therefore, following the general approach, yarn twist is not included in the present force model. Yarn pre-twisting, on the other hand, has an influence on other yarn parameters [Pan and Brookstein 2002]. This effect is captured by varying bending stiffness and yarn radius accordingly.

Figure 4:
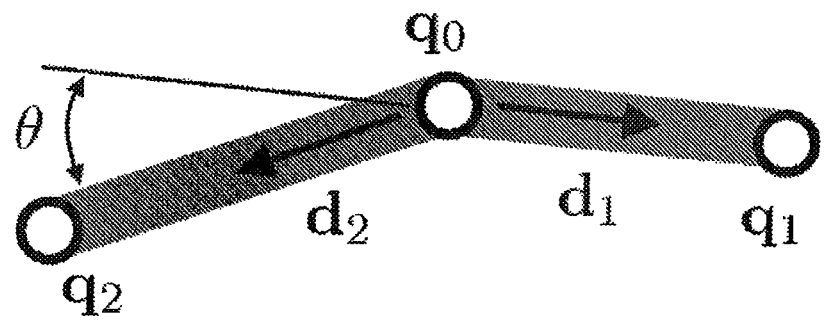
FIG. 4 depicts the bending angle A between two adjacent yarn segments.

Regarding the yarn bending included in the force model, given two consecutive yarn segments [$q_2$, $q_0$] and [$q_0$, $q_1$], as shown in FIG. 4, an elastic potential V is defined based on the bending angle $\theta$ between the yarn segments:

$$V = k_b \frac{\theta^2}{\Delta u} \qquad (2)$$

$\Delta u$ is the summed arc length of both segments. For small bending angles $\theta$, the bending stiffness $k_b$ is due to internal forces during yarn bending, and can be defined as $k_b = B\pi R^2$, with B the bending modulus and R the yarn radius. For large bending angles $\theta$, the deformation of loops leads to contact between loops of different rows, or bending jamming. This effect is modeled by increasing the bending stiffness $k_b$ after a certain threshold ($\theta = \pi/2$, for instance).

To initialize the yarn layout for a garment, the desired loop density in the course and wale directions, the yarn radius R, and the geometric shape of a loop (i.e., the relative position of the nodes within a loop) is set. Besides, for each stitch, it is indicated whether it is a knit or purl stitch. The resulting layout may not be at rest in this initial configuration due to unbalanced bending energies, and the garment may compress and wrinkle when relaxed. Compensation for the rest-shape bending can be done by redefining loop densities in the following way: first relax a rectangular sample of 5×5 cm with the same mechanical and geometric parameters, and record the average shape of loops after relaxation; then, apply this loop shape in the initialization of the yarn layout for the garment, by redefining the loop density accordingly. Without bending compensation, a garment shrinks and exhibits unnatural wrinkles. By applying rest-shape bending compensation, the piece of fabric shows natural behavior.

Figure 5:
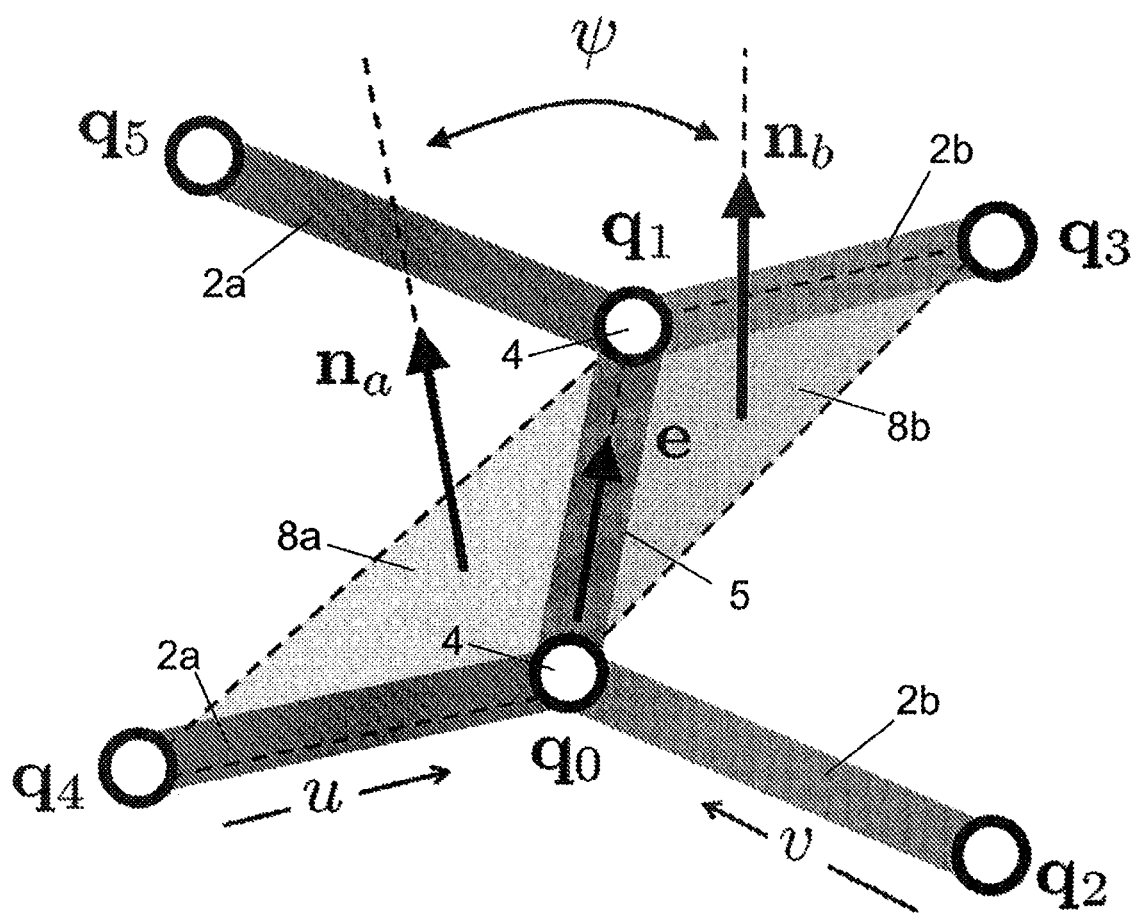
FIG. 5 represent the stitch wrapping used in the force model.

Regarding the stitch wrapping included in the force model, at each stitch contact 5 two yarn segments are wrapped around each other, as shown in FIG. 3, producing a deformation energy. FIG. 5 shows the stitch wrapping in more detail, where q0 and q1 are the contact nodes 4 of the stitch contact 5 comprising two segments belonging to two different loops (2a, 2b). The amount of wrapping is measured as the relative angle between opposite yarn segments around the central axis of the stitch contact 5. Given the two contact nodes 4, q0 and q1, of the stitch contact 5, the unit vector e between them defines the central axis. A wrapping angle $\psi$ is defined between the yarn segment from q0 to q4 and its opposite yarn segment from q1 to q3, and similarly for the other two segments [q0, q2] and [q1, q5]. Specifically, the angle between the unit vectors ($n_a$, $n_b$) orthogonal to the triangles (8a, 8b) formed by such yarn segments and the central axis, which acts as a hinge, is computed.

For each pair of opposite yarn segments, an elastic potential V is defined based on the deviation between the wrapping angle $\psi$ and a rest angle $\psi_0$:

$$V = \tfrac{1}{2} k_w L (\psi - \psi_0)^2 \qquad (3)$$

where $k_w$ is the stitch wrapping stiffness, an empirically set stiffness, and L is the rest length of the stitch contact 5. After testing different values for the rest angle $\psi_0$, $\pi/2$ is preferably chosen for a visually realistic wrapping effect, although other different rest angles may be used.

The yarn segments at stitch contacts 5 have the natural tendency to unwrap. In the garter pattern, adjacent rows of loops unwrap in opposite directions. However, in the stockinette pattern, where they unwrap in the same direction, a characteristic behavior emerges: the fabric has a tendency to curl both in wale and course directions. This effect is particularly noticeable at the boundaries of the fabric. In the rib pattern, on the other hand, each pair of stitches curls in opposite direction, leading to a natural compression of the fabric.

The present method also allows to model inter-yarn sliding with friction forces. For sliding friction, Coulomb friction is modeled on sliding coordinates using anchored springs. According to Coulomb's model, friction force is limited by the amount of normal compression at inter-yarn contact. This inter-yarn normal compression for knitted cloth is estimated by assuming static equilibrium of stretch, bending, and stitch wrapping forces. To estimate the normal force due to bending and stitch wrapping, the forces are projected onto the estimated normal at each contact node 4. To estimate the normal force due to stretch, on the other hand, we offset nodes along the contact normal to account for yarn volume. Sliding friction is governed by the friction coefficient $\mu$.

When an end node of one stitch contact 5 slides, the other end node should slide too to preserve the material length of the contact stitch and avoid artificial creation or deletion of material. The material length of stitch contacts 5 is assumed to remain constant. This is enforced by using a penalty energy. For a stitch contact 5 between nodes q0 and q1 as shown in FIG. 5, with arc length l=u1−u0 and rest length L, the energy V is defined as:

$$V = \frac{1}{2} k_l L \left( \frac{l}{L} - 1 \right)^2 \quad (4)$$

where $k_l$ is the stiffness of the length constraint.

Figure 6A:
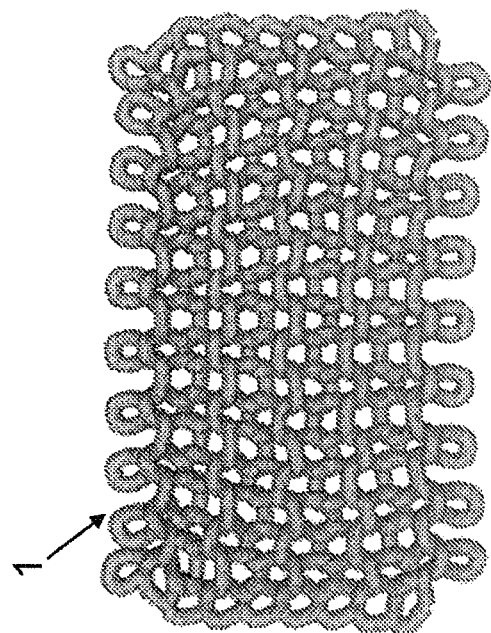
FIGS. 6A-6C shows a small piece of fabric stretched to the point where inter-yarn friction cannot prevent yarn sliding, and plastic deformations are evident when forces are released and the fabric goes back to rest.
Figure 6B:
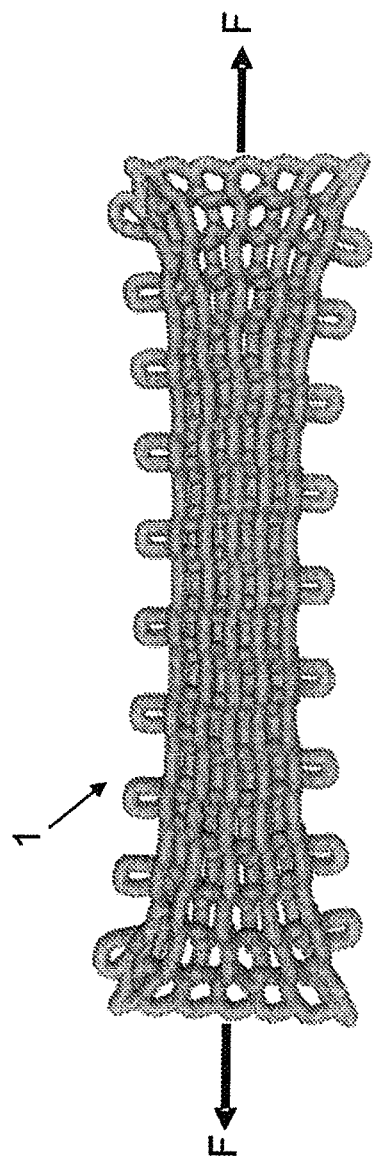
Figure 6C:
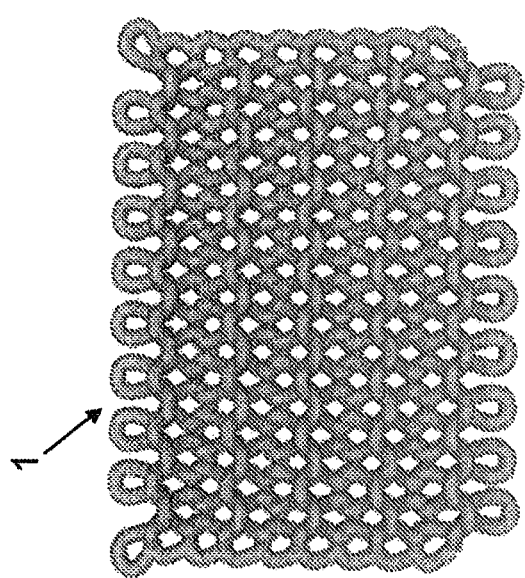

Yarn sliding is negligible under small forces, because friction keeps the yarns in place. However, sliding may indeed take place under moderate forces, such as extensive stretch. In that case, sliding produces plastic deformations that remain when forces are released. FIGS. 6A-6C show an example where a small piece of knitted fabric 1 (FIG. 6A) is overly stretched with a stretching force F to the point where yarns slide (FIG. 6B), and plastic deformation is present when the stretching forced F applied on the fabric 1 is released (FIG. 6C).

The equations of motion are formulated using the Lagrange-Euler equations, and integrated them in time using implicit backward Euler with Newton iteration.

Numerical large-scale examples for several knitted cloth simulation scenarios are now described. All our examples were executed on a 3.4 GHz Quad-core Intel Core i7-3770 CPU with 32 GB of memory, with an NVIDIA Tesla K40 graphics card with 12 GB of memory. Simulations were executed with a time step of 1 ms, and the parameter values used in the large-scale examples are listed in FIG. 7. With implicit integration, the regularity of the patterns produces a sparse system matrix with at most 11 non-zero 5×5 blocks per block-row. Blocks produced by collisions and seams are handled in a tail matrix.

The examples are the following:

Sweater: A dancing female mannequin is dressed with a sweater made of 56K loops (224353 stitch contact nodes). The sweater is knit in Garter style, with seams on the sides of the body, the shoulders, the sleeve-body junctions, and along the sleeves.

In the textile industry, stitch density is measured as the number of stitches per inch, and is called Gauge (GG). The simulated sweater has 6.5 stitches per inch, a gauge commonly found in real sweaters. The simulation took 96 seconds per visual frame (at 30 fps), roughly 7× faster than the approach by [Kaldor et al. 2010] for a model of similar characteristics (without accounting for hardware differences).

Sleeveless T-shirt: A sleeveless T-shirt model is used to dress a male mannequin performing highly dynamic karate motions. The T-shirt has 325K loops (1.25M stitch contact nodes), 20 stitches per inch, and is knit in Garter style. This gauge (20 GG) is commonly found in off-the-shelf T-shirts made of carded cotton. The simulation took an average of 7.4 minutes per visual frame (at 30 fps), showing how garments with life-like resolutions can be computed in tractable time with the present approach.

Sleeveless pullover: The stockinette pattern produces a curl behavior in the fabric, and in the model this effect is captured by the stitch wrapping forces, showing the effect of curl in the stockinette garment. The garment is a sleeveless wool pullover, with 8750 loops (34416 stitch contact nodes). As in real cloth, the curl effect is particularly visible at the edges of the fabric. The lower edge and the collar wrap around themselves.

Figure 8:
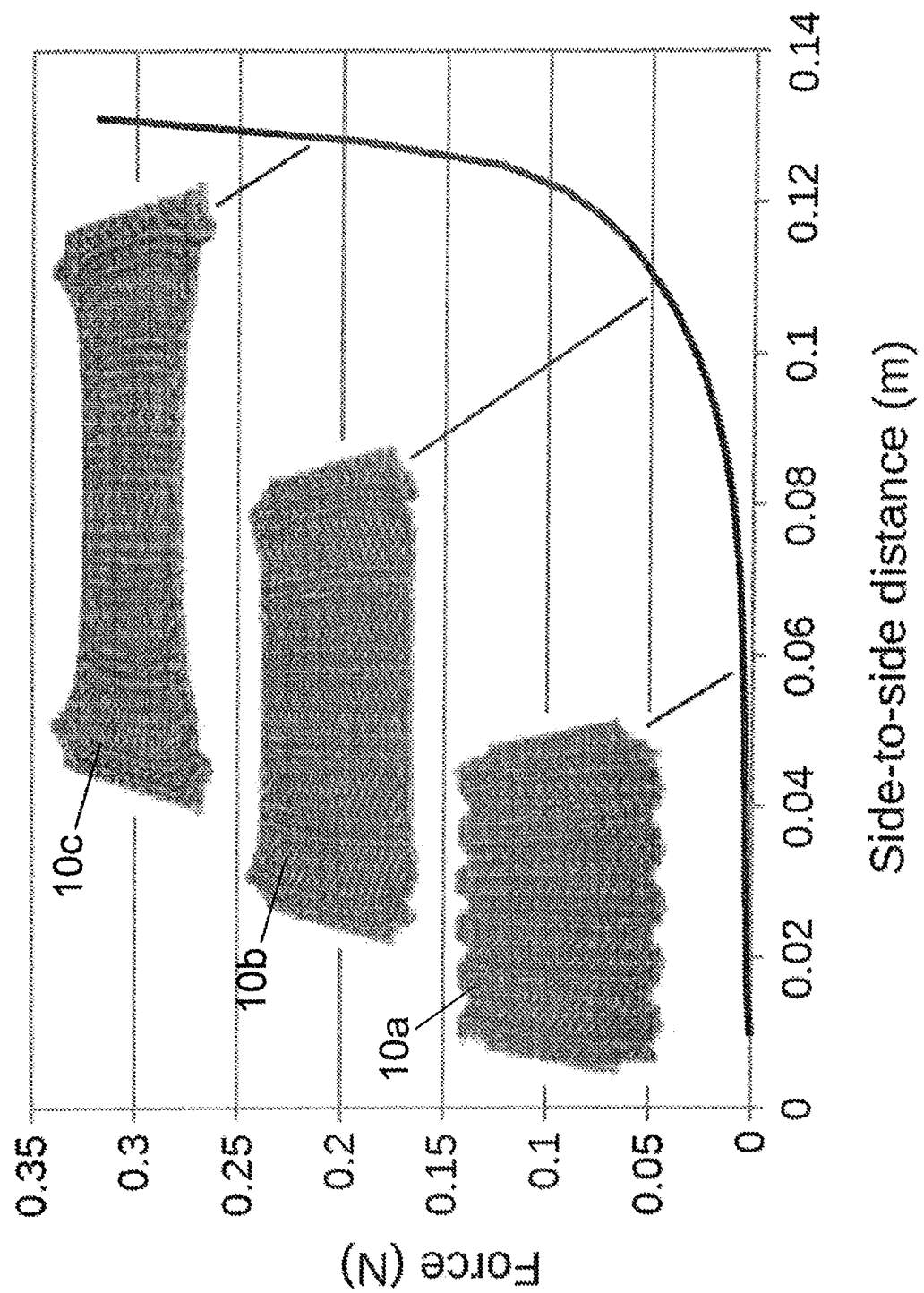
FIG. 8 depicts an example of nonlinear behavior observed when stretching a piece of rib fabric.

One of the main advantages of the present yarn-level model is the ability to naturally capture complex nonlinear deformations. FIG. 8 shows a force plot of a stretched rib fabric, an example of nonlinear behavior observed when stretching a piece of rib fabric, which appears compressed at rest, and with the characteristic ridges of the rib pattern. The highly nonlinear behavior is evident, with three different regimes (10a, 10b, 10c) corresponding mainly to opposing wrapping, bending and stretching forces. The plot shows the force applied to one side of the fabric vs. the side-to-side distance, and highlights the existence of the three regimes (10a, 10b, 10c) during the deformation. In the first regime 10a, the ridges are flattened, and stretch is opposed mainly by stitch wrapping forces. In the second regime 10b, the loops are deformed, and stretch is opposed mainly by yarn bending. In the third regime 10c, the yarns themselves are stretched. The nonlinear stretch behavior emerges naturally when using the present yarn-level model thanks to the low-level structural representation and force models, but is difficult to capture using traditional mesh-based approaches.

The invention claimed is:

1. Computer implemented method for simulating a behavior of a knitted fabric at yarn level, the method comprising:
    retrieving structural information of a knitted fabric comprising a plurality of stitches, a stitch comprising at least a first yarn connected to a second yarn through one or more loops, the first and the second yarns in contact with each other between a first contact point and a second contact point, said structural information comprising a computer readable representation of a layout of the knitted fabric including information about the one or more loops in the plurality of stiches, wherein the structural information of the knitted fabric includes a stitch wrapping stiffness (Ky), wherein the wrapping forces at each stitch contact includes a computation of an elastic potential V according to the following equation:

$$V = \tfrac{1}{2} k_w L (\psi - \psi_0)^2$$

wherein ψ is a wrapping angle, ψ is a rest angle and L is a rest length of the stitch contact;

representing each stitch using a model comprising at least the two contact points, wherein the model for each contact point comprises a 3D position coordinate representing a position of the contact point within the simulated knitted fabric and two sliding coordinates representing changes in position of the contact point along the first yarn and along the second yarn during the simulation;

measuring forces on each contact point based on a force model, the forces being measured on both the 3D position coordinate and the sliding coordinates of the contact point, the force model comprising wrapping forces to capture an interaction of the yarns at the stitches;

calculating a movement of each contact point at a plurality of time steps during the simulation based on equations of motion that account for a mass density distributed uniformly along the yarns, the measured forces, and a set of boundary conditions applied at the plurality of time steps; and providing a computer graphic output of a yarn-level representation of the knitted fabric comprising a nonlinear deformation resulting from the forces.

2. The method of claim 1, wherein the structural information of the knitted fabric further includes one, or a combination of two or more, of: a density of a yarn of the stitch, a radius of the yarn, and a mechanical parameter for the yarn.

3. The method of claim 2, wherein the mechanical parameter comprises one, or a combination of two or more, of: a bending modulus, an elastic modulus, a stitch wrapping stiffness, a sliding friction coefficient, a damping-to-mass ratio, damping-to-stiffness ratio.

4. The method of claim 1, wherein the structural information of the knitted fabric includes a stitch wrapping stiffness, and wherein the wrapping forces at each stitch contact is based on an elastic potential computed as a function of a wrapping angle, a rest angle and a rest length of the stitch contact.

5. The method of claim 1, wherein the structural information of the knitted fabric includes a bending modulus of a yarn of the stitch, and wherein the force model includes a bending force determined using an elastic potential between two segments of the yarn computed as a function of a radius of the yarn, a summed arc length of the two segments, and a bending angle between the two segments.

6. The method of claim 1, wherein the structural information of the knitted fabric includes a sliding friction coefficient of a yarn of the stitch, and wherein the force model is based on the sliding friction coefficient and the sliding coordinates.

7. The method of claim 1, wherein the structural information of the knitted fabric includes an elastic modulus of a yarn of the stitch, and wherein the force model includes a stretch force.

8. A computer program product for simulating a behavior of a knitted fabric at yarn level, the computer program product comprising computer usable program code stored on a computer readable storage medium storing instructions that, when executed by a computer, is configured to perform the steps of the computer implemented method defined in claim 1.

9. A system for simulating a behavior of a knitted fabric at yarn level, the system comprising:

a data storage configured to store structural information of the knitted fabric, the structural information comprising a layout of the knitted fabric, a density of stitches, and a type of stitch; and a processor configured to:

retrieve the structural information of the knitted fabric, the knitted fabric comprising a plurality of stitches, a stitch comprising at least a first yarn connected to a second yarn through one or more loops, the first and the second yarns in contact with each other between a first contact point and a second contact point, said structural information comprising a computer readable representation of a layout of the knitted fabric including information about the one or more loops in the plurality of stiches, wherein the structural information of the knitted fabric includes a stitch wrapping stiffness (Ky), wherein the wrapping forces at each stitch contact includes a computation of an elastic potential V according to the following equation:

$$V = \tfrac{1}{2} k_w L (\psi - \psi_0)^2$$

wherein ψ is a wrapping angle, $\psi_o$ is a rest angle and L is a rest length of the stitch contact;

represent each stitch using a model comprising at least the two contact points, wherein the model for each contact point comprises a 3D position coordinate representing a position of the contact point within the simulated knitted fabric and two sliding coordinates representing changes in position of the contact point along the first yarn and along the second yarn during the simulation;

measure forces on each contact point based on a force model, the forces being measured on both the 3D position coordinate and the sliding coordinates of the contact point, the force model comprising wrapping forces to capture an interaction of the yarns at the stitches;

calculate a movement of each contact point at a plurality of time steps during the simulation based on equations of motion that account for a mass density distributed uniformly along the yarns, the measured forces, and a set of boundary conditions applied at the plurality of time steps; and provide a computer graphic output of a yarn-level representation of the knitted fabric comprising a nonlinear deformation resulting from the forces.

* * * * *